United States Patent [19]
Yamazaki et al.

[11] Patent Number: 5,276,351
[45] Date of Patent: * Jan. 4, 1994

[54] ELECTRONIC DEVICE AND A MANUFACTURING METHOD FOR THE SAME

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[*] Notice: The portion of the term of this patent subsequent to Oct. 15, 2008 has been disclaimed.

[21] Appl. No.: 835,745

[22] Filed: Feb. 13, 1992

Related U.S. Application Data

[60] Continuation-in-part of Ser. No. 731,871, Jul. 18, 1991, abandoned, which is a division of Ser. No. 417,319, Oct. 5, 1989, Pat. No. 5,057,900.

[30] Foreign Application Priority Data

Feb. 13, 1991 [JP] Japan .................................. 3-41258

[51] Int. Cl.$^5$ ............................................ H01L 23/28
[52] U.S. Cl. ...................................... 257/666; 257/669; 257/787
[58] Field of Search ............... 257/666, 669, 787, 671, 257/677

[56] References Cited

U.S. PATENT DOCUMENTS

| | | |
|---|---|---|
| 3,644,801 | 2/1972 | Sheldon . |
| 3,878,554 | 4/1975 | Mikome et al. . |
| 4,079,511 | 3/1978 | Grabbe . |
| 4,396,458 | 8/1983 | Platter et al. . |
| 4,486,945 | 12/1984 | Aigoo . |
| 4,562,091 | 12/1985 | Sachdev et al. . |
| 4,770,897 | 9/1988 | Wu . |
| 4,862,586 | 9/1989 | Osada . |
| 4,878,990 | 11/1989 | Dugan et al. . |
| 4,888,449 | 12/1989 | Crane et al. . |
| 4,942,454 | 7/1990 | Mori et al. ............................ 257/787 |
| 5,121,187 | 6/1992 | Yamazaki et al. .................... 257/666 |
| 5,134,459 | 7/1992 | Maeda et al. ........................ 257/666 |

FOREIGN PATENT DOCUMENTS 2090466 7/1982 United Kingdom .

*Primary Examiner*—Rolf Hille
*Assistant Examiner*—Roy Potter
*Attorney, Agent, or Firm*—Sixbey, Friedman, Leedom & Ferguson

[57] ABSTRACT

A method for manufacturing a lead frame comprises the steps of covering, with a cover film, a die to which an electronic device is attached and a conducting section of a lead section to be electrically connected to the die, covering the whole of the die and lead section and the cover film with an inorganic protective film, and removing the cover film and the protective film formed over the cover film to partly expose the die and the conducting section for electric connection.

10 Claims, 11 Drawing Sheets

ELECTRONIC DEVICE AND A MANUFACTURING METHOD FOR THE SAME

This application is a continuation-in-part of application Ser. No. 07/731,871, filed Jul. 18, 1991, now abandoned, which is a division of Ser. No. 07/417,319, filed Oct. 5, 1989 U.S. Pat. No. 5,057,900.

BACKGROUND OF THE INVENTION

1. Field of The Invention

The present invention relates to a method for manufacturing a lead frame or substrate, and in particular, to a method for manufacturing a lead frame or substrate for an electronic device such as a DIP or Flat Pack Package wherein a semiconductor or the like is mounted on the lead frame or substrate or the like in the electronic device and sealed in a molding material.

The present invention also relates to a member such as a lead frame and to an electronic device which comprises a lead frame.

2. Description of the Prior Art

FIG. 1 shows the cross section of one part of a conventional electronic device. In FIG. 1, a lead frame 1 is made of a metal such as a copper, 42 ALLOY or the like, and comprises a die 1a for mounting a semiconductor chip 3, and a lead section, that is an inner lead 1b and an outer lead 1c. The semiconductor chip 3 is die-attached e.g. by printing gold onto the surface of the die 1a, so that a gold-silicon alloy is formed at 300° C. to 400° C., and the semiconductor chip 3 is mounted using the gold-silicon alloy as an adhesive 5. In place of the gold-silicon alloy, it is also possible to use an adhesive such as an organic resin of a polyamide type or of an epoxy type, or a silver paste containing an organic material, or the like. An excess 5a of the adhesive is squeezed out during the mounting operation as shown in the drawing. The semiconductor chip 3 and the inner lead 1b are wire-bonded using a gold wire 9, after which the entire package is sealed in a plastic molding 7 with the exception of the outer lead 1c which is to be exposed.

When an organic adhesive is used as the adhesive 5, the adhesive in the flowable state is hardened by a chemical or thermochemical reaction, so that the semiconductor chip is mounted to the die 1a. This method has the advantages that it is inexpensive and easily adaptable to mass production. However, on the other hand, the adhesive 5 and the excess adhesive 5a are gradually vaporized and moved as indicated by the arrow 5b when heated in the range of 100° to 300° C., and an adhering material 5c is formed on the surface of the semiconductor chip 3 and lead frame 1. In addition, natural oxide and a suboxide 15 are formed on the lead frame 1. The adhering material 5c and the suboxide 15 are extremely easy to strip from the surface of the lead frame and therefore end up damaging the adherence of the subsequently-applied molding and protective film to the lead frame 1.

At the rear surface of the lead frame 1, it is easy for moisture to permeate into the plastic molding 7 from outside and to be accumulated thereon. When the device is usually dipped into molten solder, due to heat distortion or sudden expansion of vaporizing water, stress is produced causing the molding to expand. For this reason, cracks 11 and voids 13 are produced at the boundary between the die 1a and the molding 7 in areas where the adherence is poor.

FIG. 9 shows the cross section of one part of another conventional electronic device. In FIG. 9, a lead frame 101, 105 and 102 (reference numeral 102 designates a die to which an IC chip 100 is attached) is made of a metal such as copper, 42 ALLOY or the like. The surface thereof is printed with a good conductor such as gold. The IC chip is die-attached, e.g., by printing gold onto the surface of the die 102, so that a gold-silicon alloy 104 is formed at 300° C. to 400° C., and the IC chip is mounted using the gold-silicon alloy as an adhesive. In place of the gold-silicon alloy, it is also possible to use an adhesive such as a silver paste, a glass insulating material or an organic substance heated to 100° to 400° C. In case of an organic silver paste, an electronic device such as an IC chip is fixed on the die 102 of a metal lead frame with a bond 104 of a silver paste comprising a polyamide or epoxy organic resin and a silver mixed therein. In this case, the electronic device can be fixed on the lead frame by providing a liquid bond 104 between the electronic device and the lead frame and subsequently solidifying the liquid bond 204 by chemical reaction or thermochemical reaction. However, by making a package 103 made of organic resin after the fixing step to enclose the electronic device and the lead frame, an adhering material 106 which easily peels off and a suboxide 107 are produced between the organic resin of the package and the copper or 42 ALLOY. For this reason, moisture permeates into the plastic molding package 103 through the adhering material and the suboxide and collects at the rear surface of the die 102 or the like under usual conditions as well as under severe conditions such as in water or in a high humid atmosphere. This moisture is rapidly vaporized to produce cracks 108 and 109 and a void 110 by soldering at 260° C. for 3 to 10 seconds, for example.

Although a conventional method of fixing the electronic device with organic bond or organic silver paste bond is very suitable for mass production at a low cost, components vaporized from the organic bond are absorbed on the lead frame or the die in an atmosphere at room temperature to 300° C., resulting in a poor adhesion between the lead frame and a molding resin or a protective film.

Further, so-called lead on chip (LOC) structure as shown in FIG. 9 has the advantage that high integration and large scaling of package chips are possible; however, there is the probability that the lead frame undesirably comes in contact with the surface of the chip since the lead frame 101 is located above the chip, that is, there is the probability that short circuit is formed by the contact. In order to prevent the contact, an insulating tape is usually inserted between the lead frame and the chip in the LOC structure. However, the use of such a tape complicates the production process. Further, there is the probability that the chip may suffer mechanical damage from contact between the chip and the insulating tape.

SUMMARY OF THE INVENTION

An object of the present invention is to provide, with due consideration to the drawbacks of such conventional electronic devices, an electronic device with high reliability.

Another object of the present invention is to provide a method for manufacturing an electronic device of mold package type having an increased moisture resistance and adherence.

Another object of the present invention is to provide a package of the electronic device enclosed in a molding material with the prevention of the occurrence of cracks and voids in the package.

These objects are achieved in the present invention by the provision of a single-layer or multi-layer protective film of an inorganic material such as silicon nitride, silicon oxide, silicon carbide, or DLC (Diamond-Like Carbon), or the like, to cover the lead frame other than the electric contacts of the lead frame.

Specifically, in the present invention, the electric contacts of the lead frame (for example, parts which are wire-bonded, and parts which are attached to the semiconductor chip) are first covered with a cover film, then a protective film is formed of an organic material over the lead frame, after which, using the lift-off method, the cover film and the protective film formed over it are removed to once again expose the electric contacts.

In case of provision of an electronic device (e.g., an IC (integrated circuit) chip) on a die of a lead frame, the electronic device is fixed on the die in a conventional method and then the entire surface of the electronic device or electric contacts thereof to be wire-bonded are covered with a cover film, then a protective film is formed of an inorganic material over the lead frame and the electronic device by plasma CVD or sputtering, after which, using the lift-off method, the cover film and the protective film formed thereon are removed at the same time to expose the entire surface of the electronic device or the electric contacts thereof. This is particularly suitable for the case where the electronic device is fixed on the die with an organic binder. That is, the above-described components vaporized on the lead frame or the die to prevent the reliability from lowering. If the vaporized components were to be absorbed on the lead frame or the like, the absorbed components can be removed by evacuation carried out in the subsequent film forming step and then the insulating inorganic protective film can be formed thereon.

In the present invention, the properties of organic resin molding materials, that is poor adherence to metals and good adherence to inorganic materials, are utilized. By means of the present invention, because the lead frame is covered in advance by a protective film, it is possible to avoid the soiling of the lead frame in the subsequent process in which the electronic parts are attached by means of an adhesive. In addition, because adhering material and suboxides are removed from the surface of the lead frame, the adherence of the material to the lead frame is improved. Also, the permeation of moisture through the undersurface of the package over a long period of time can be prevented, and there is no drop in reliability. Otherwise, the drop of reliability would be caused by water and chlorine in the organic resin, by the occurrence of a reaction between the water and chlorine and the metal of the die resulting in the formation of suboxides. For this reason, there is no breakage, no matter how thin the molding, and no swelling from the application of heat when the package is mounted onto the PCB.

In addition, because the lead frame is protected by inorganic materials, the electronic device can be handled without so much carefulness, so that there is no drop in yield, and mass production is possible.

In the present invention, it is not necessary to interpose an insulating tape between the electronic device (e.g., IC chip) and the lead frame since the lead frame is provided with the protective insulating film thereon and the protective insulating film can prevent undesirable contact from being made between the electronic device and the lead frame or between adjacent lead frames.

FIG. 6 shows a longitudinal cross sectional view showing an IC package comprising a member (a lead frame) according to the present invention.

In FIG. 6, a chip 200 is fixed on a die 202 of a lead frame with a silver paste 204. The chip 200 may be an IC chip or an electronic device such as a capacitor or an inductor or the like. An aluminum pad 212 of the chip 200 and a conductive portion 213 (e.g., a gold plating) are wire-bonded to each other by a gold wire 211 to electrically connect the aluminum pad 212 to a stem 201 of the lead frame.

In the present invention, a natural oxide of a metal or an organic substance are not formed on the surfaces of the die 202 and the stem 201 of the lead frame since the surfaces of the die 202 and the stem 301 are coated with the inorganic material 220. Adhesion between the lead frame and the molding material can be improved by taking advantage of high adhesion between an inorganic material and an organic molding material which is poor in adhesion to a metal.

In FIG. 6, the lead frame 201, 202 is made of 42 ALLOY or copper and a portion thereof to which the electronic device 200 is attached and a portion thereof wire-bonded (that is, a portion on which a gold is printed) are not provided with an inorganic insulating film 220. The die 202 may be perforated to alleviate concentration of stress caused therein by heat during soldering. After the chip 200 is fixed on the die 202, the stem and the chip are wire-bonded to each other by the gold wire and thereafter the lead frame and the chip are enclosed by a molding material.

Referring to FIGS. 7(A) to 7(E), a method for forming a structure according to the present invention will be described below. A stem 301 and a die 302 of a lead frame are fixed by an organic resin or by a mechanical support as shown in FIG. 7(A). A leg 305 of the lead frame may be provided in an organic resin as shown in FIG. 7(A). Then, a gold film 313 is selectively formed on a portion of the stem 301 by printing method or the like. Inversely, the gold film may first be formed on the stem followed by fixing the stem 301 and the die 302 by an organic resin or by a mechanical support.

Then, films 322 made of an organic resin or the like are formed on portions of the stem and the die by screen printing or the like as shown in FIG. 7(B).

Further, a protective film 320 made of an inorganic material is formed on the entire structure by plasma CVD, photo CVD, sputtering or the like as shown in Fig. 7(C). At this time, it is important that the film is deposited even on the concealed surface at a substantially even thickness, that is, with an excellent step coverage. For example, the film should be deposited at a substantially uniform thickness on the back surface of the die 302 and the upper surface of the stem. Therefore, a vacuum evaporation is not suitable for the formation of the protective film. Of course, the leg 305 of the lead frame is not coated with the protective film since the leg is buried in the organic resin during the formation of the protective film.

It is necessary that the inorganic protective film is heat resistant and oxidation resistant. For example, the film is not qualitatively changed even when it is subjected to an atmosphere at 500° C. for an hour. Therefore, a material consisting mainly of silicon oxide, silicon nitride or silicon carbide is suitable for the inorganic protective film.

Then, the entire structure shown in FIG. 7(C) is immersed in an organic solvent and an ultrasonic wave is applied thereto. Thereby, the organic resin films 322 and the inorganic protective film formed thereon are removed at the same time in the so-called lift-off manner. As a result, a portion of the die to which an electronic device (e.g., an IC chip) is to be attached and a portion of the stem to be wire-bonded are exposed. Then, a binder 304 is applied to the die 302. Then, an electronic device 300 is inserted and fixed on the die 302. Then, the electronic device and the stems are wire-bonded to each other by gold wires 311 to obtain a structure shown in FIG. 7(D).

Finally, the electronic device and the lead frame are enclosed by a molding material (e.g., an epoxy organic resin), that is, a package 303 is formed, as shown in FIG. 7(E). In FIG. 7(E), the electronic device is enclosed int he package and the lead frame is partially enclosed in the package and each of the gold wires is connected with the lead frame at one end thereof above the electronic device.

According to the above method, the inside of the package 303 is covered with the inorganic protective film nearly completely while the outside of the package is not covered with the inorganic protective film. Thus, the structure shown in FIG. 7(E) can conveniently be handled int he same way as a conventional one during the mounting.

In the above example according to FIGS. 7(A) to 7(E), the die 302 is utilized; however, the present invention can be applied to structure provided with no die therein.

In the above example according to FIGS. 7(A) to 7(E), the step of forming a film on the lead frame is carried out after the step of fixing the stem and the die; however, the fixing step may be carried out after the step of forming a film on the lead frame.

A single layer consisting mainly of a material selected from the group consisting of silicon oxide, silicon carbide, silicon nitride, hard carbon and a mixture comprising such materials at a stoichiometric ratio or a non-stoichiometric ratio is suitable for the inorganic protective film and also a multi-layered film comprising such layers is suitable for the inorganic protective film. The thickness thereof is preferably 30 to 500 nm.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
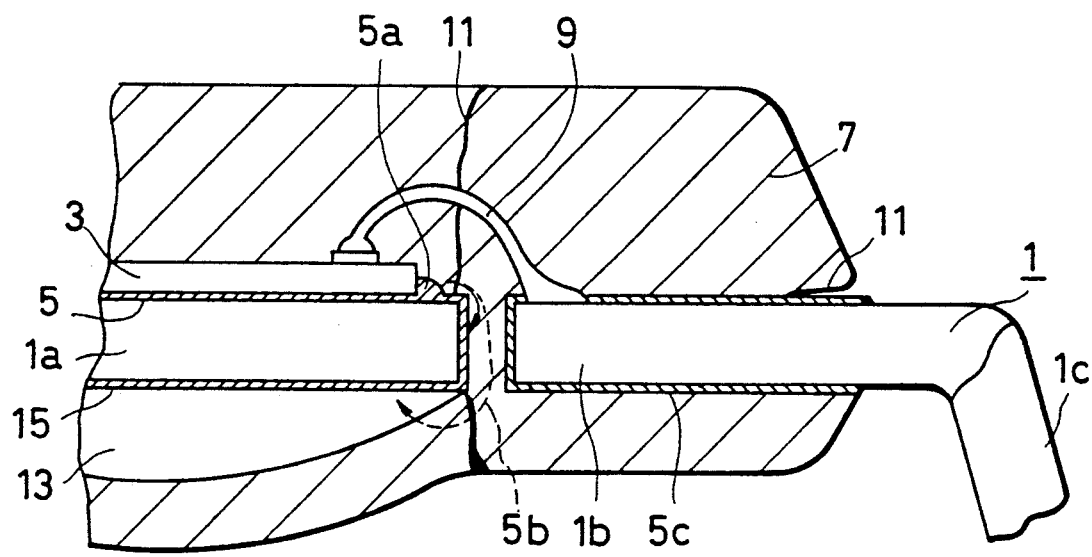
FIG. 1 is a vertical sectional view showing one part of a conventional plastic package semiconductor device after a moisture resistance test and solder test have been performed.
Figure 2:
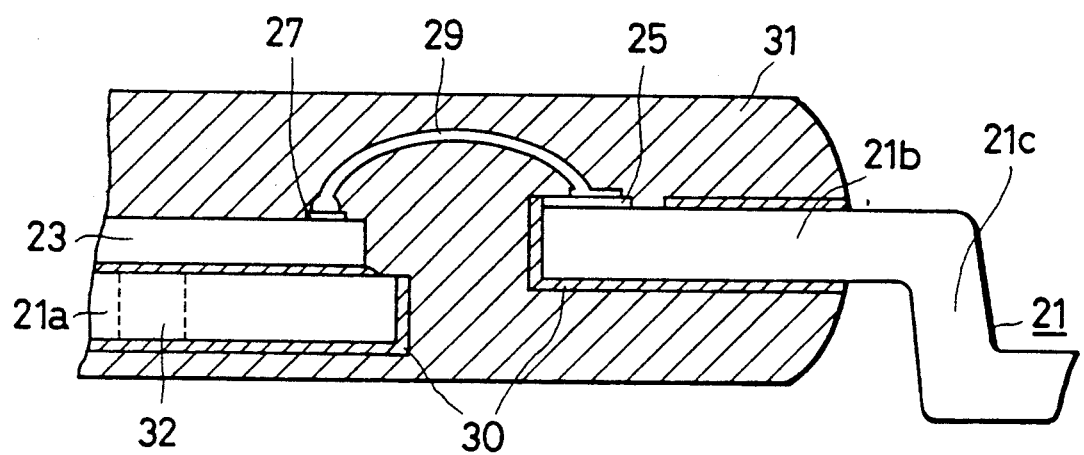
FIG. 2 is a vertical sectional view showing one part of a plastic type of semiconductor device using a lead frame in accordance with the present invention.

FIG. 2 is a vertical sectional view showing a Flat Pack Package Type of a semiconductor device using the lead frame produced in accordance with the present invention. In FIG. 2, a lead frame 21 made from 42 ALLOY or copper comprises a die 21a for die-attaching a semiconductor chip 23, and a lead section, that is an inner lead 21b and an outer lead 21c. The surface of the die 21a and the inner lead 21b are covered with an inorganic material 30 with the exception of the part on which the semiconductor chip 23 is mounted, and of a connection part 25 on which gold is printed for wire-bonding. The semiconductor chip 23 is electrically connected to a portion 25 of the inner lead 21b (where gold plating has been applied) through an aluminum pad 27 and a gold wire 29 for wire-bonding, and they are sealed by a molding 1.

Next, the process for manufacturing the lead frame of the present invention will be explained with reference to FIGS. 3A to 3D.

Figure 3A:
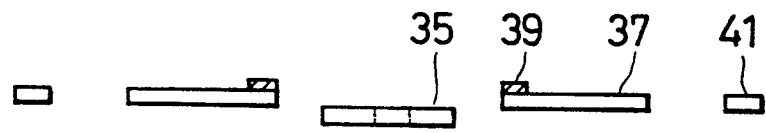
FIG. 3A to FIG. 3D are drawings showing the manufacturing process for a lead frame in accordance with the present invention.
Figure 3B:
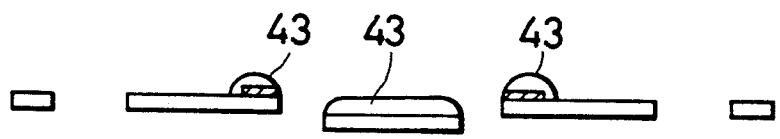

FIG. 3A is a sectional view of the lead frame which comprises a die 35 for mounting a semiconductor chip thereon, a lead section 37, a portion 39 on the lead section 37 for electrically connection by wire bonding, and a frame 41 for the lead frame. The die 35 is provided in a position lower than the lead section 37, so that a contact section provided on the chip is made on the same level or flush with the connecting portion 39. The lead frame is selectively subjected to a screen printing method in a region where it is not desired to form an inorganic protective film, specifically, on the upper surface of the die 35 on which the semiconductor chip is mounted and on the connecting portion 39 of the lead section, so that a cover 43 of organic resin such as epoxy resin or polyamide is formed thereon, as shown in FIG. 3B, by the screen printing method.

Figure 3C:
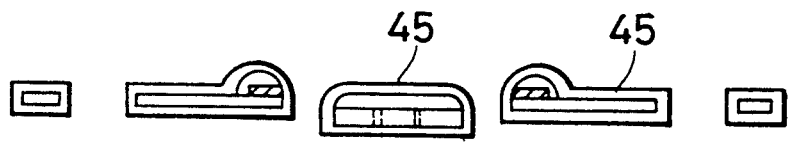

Subsequently, as shown in FIG. 3C, a protective film of an inorganic material, such as silicon nitride, silicon oxide, silicon carbide, or DLC, is formed over the entire lead frame by a plasma CVD or sputtering method (which will later be explained in detail). The inorganic material must show no qualitative changes when held for one hour in air at 500° C., must be heat-resistant, and must be resistant to oxidation. For this reason silicon nitride or silicon carbide are particularly superior for this application.

Figure 3D:
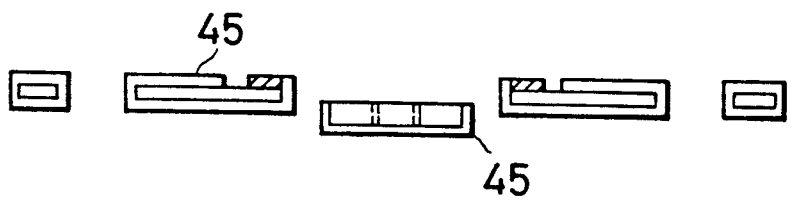

Next, the entire body is immersed in an organic solvent such as acetone or NMP (N methyl 2 pyrrolidone) and treated with ultrasonic waves to dissolve the organic material 43 to be removed, while at the same time the covering protective film thereon is removed by the lift-off method. The lead frame of the present invention as shown in FIG. 3D is manufactured in this manner.

Figure 4A:
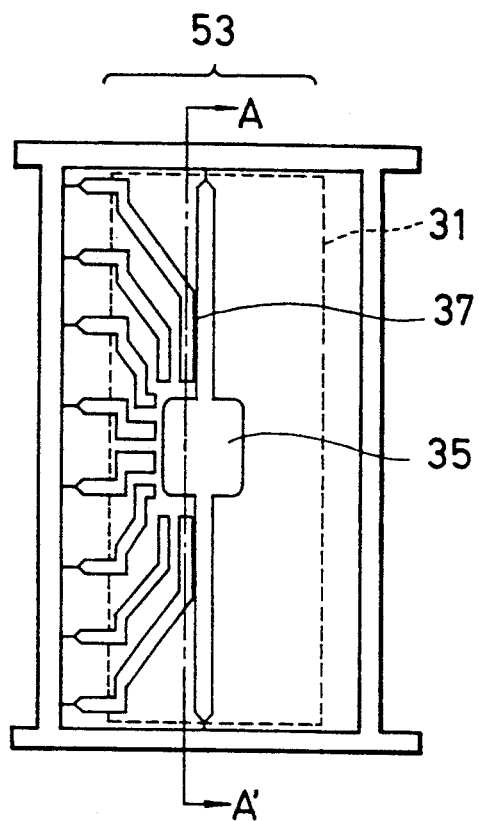
FIG. 4A is a drawing showing generally a lead frame made in accordance with the present invention, wherein the lead frame is separated from the adjacent lead frames.
Figure 4C:
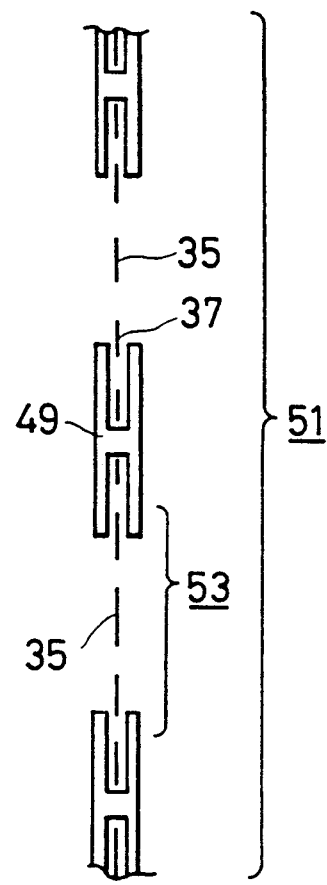
FIG. 4C is a sectional view of substrate board which comprises a plurality of substrates assembled with a jig.
Figure 4B:
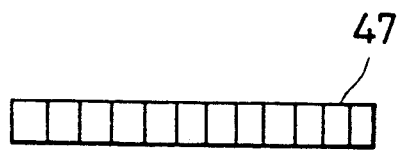
FIG. 4B is a drawing showing a substrate to which a plurality of the lead frames of FIG. 4A have been assembled.
Figure 5:
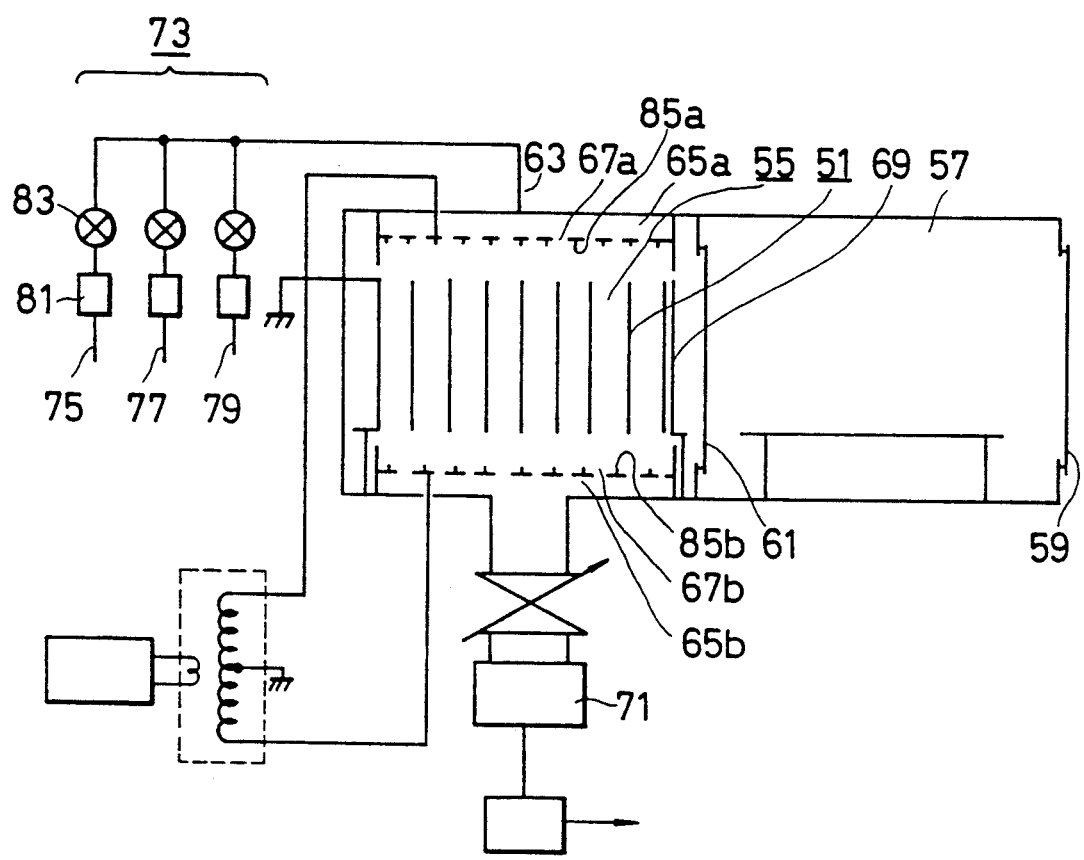
FIG. 5 is a drawing showing an external view of the plasma CVD device used in the present invention.
Figure 6:
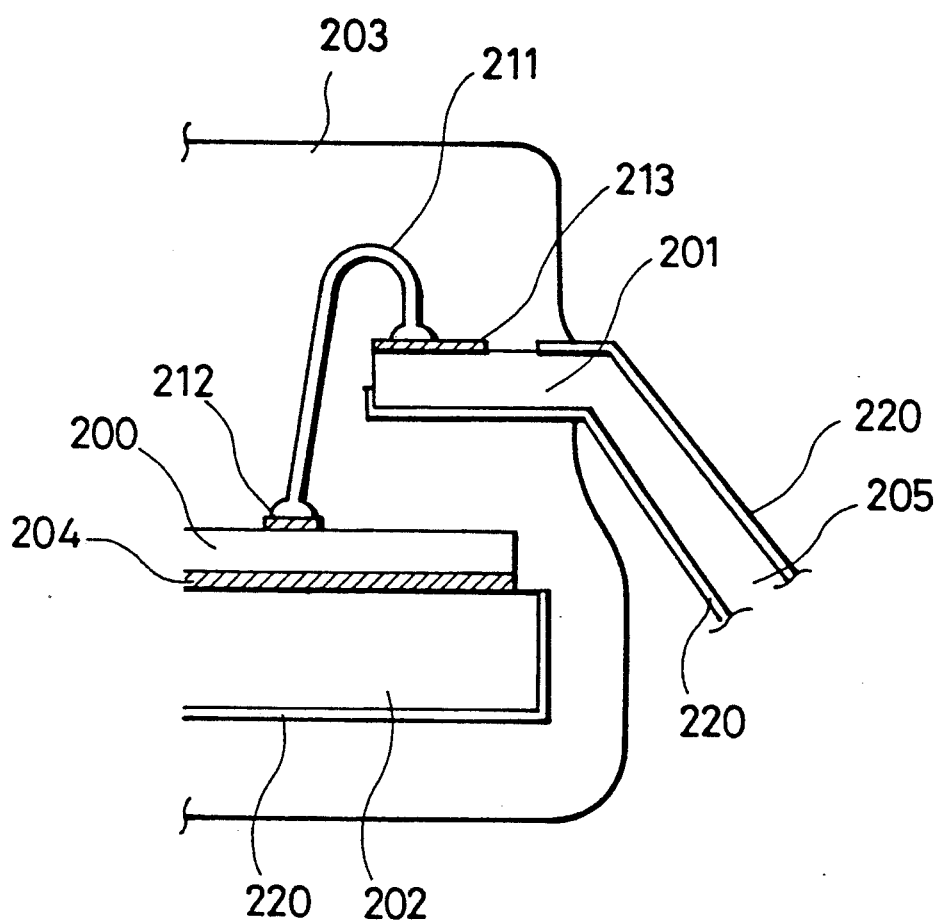
FIG. 6 is a partial cross sectional view showing an IC package of LCO structure according to the present invention.
Figure 7A:
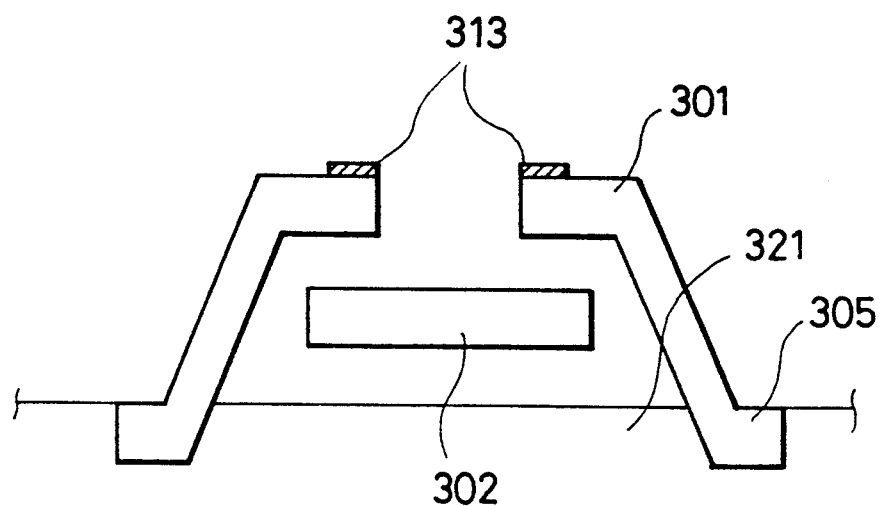
FIGS. 7(A) to 7(E) are cross sectional views showing a method for forming an IC package according to the present invention.
Figure 7B:
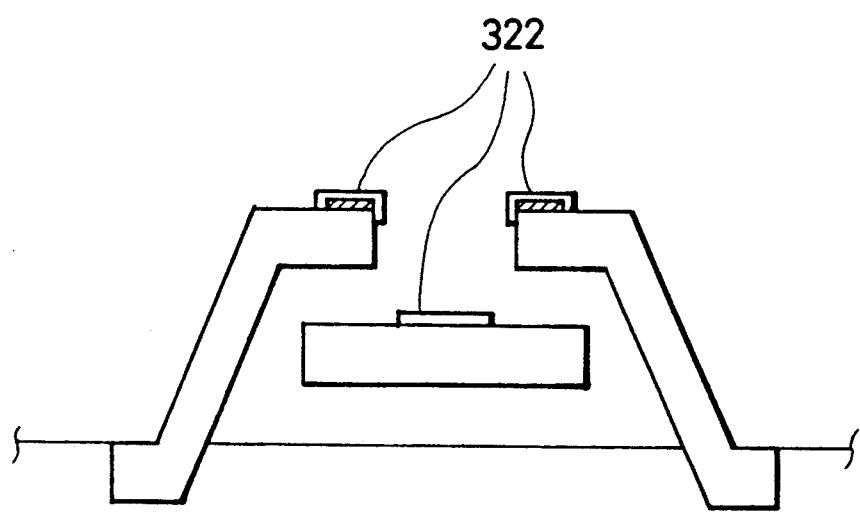
Figure 7C:
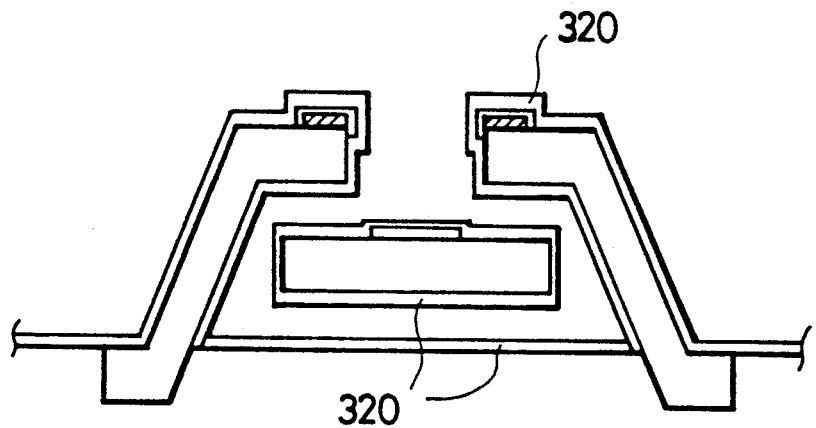
Figure 7D:
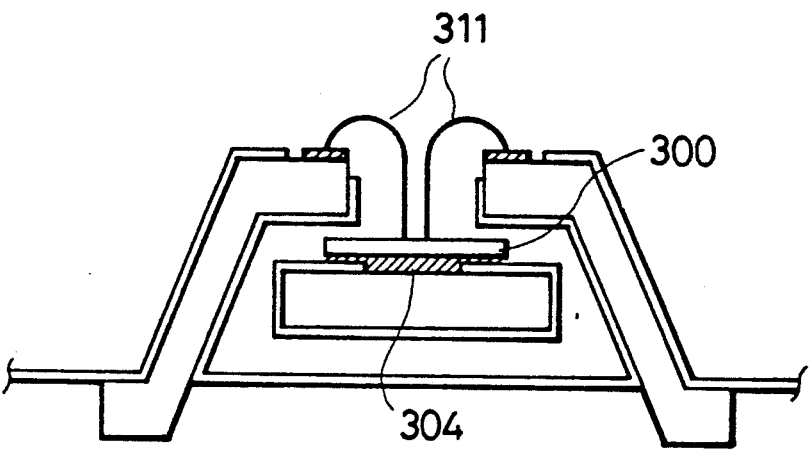
Figure 7E:
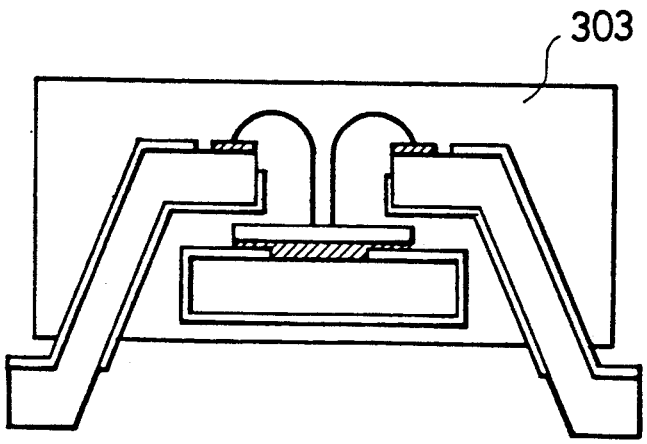

The cross section A—A' of the lead frame of FIG. 4A corresponds to the lead frame shown in FIGS. 3A to 3D. FIG. 4A shows the smallest single unit of the lead frame, while FIG. 4B shows a plurality of these units (5 to 25) assembled in a single substrate. (N.B. This assembly is also called a lead frame. However, to avoid confusion, it will be referred to here as a substrate). For simplicity, the right side of FIG. 4A has been partly omitted. As shown in FIG. 4C, 5 to 300 units of the substrate 47 are integrated by means of a jig 49 to give one substrate board 51.

FIG. 4C shows one part of the cross section, viewed from the side of the substrate board 51. On this substrate board 51, the protective film is formed as shown in FIG. 3 by the method detailed later. The part 53 in FIG. 4C corresponds to the part 53 shown in FIG. 4A.

FIG. 5 shows an exterior view of a plasma CVD device for forming a nitride film on the surface of the substrate board 51. In FIG. 5, a preparation chamber 57 is provided beside a reaction chamber 55 with a gate valve 61 positioned between them. A reaction space is enclosed by a frame-structured holder 69, a supply side hood 65a and a discharge side hood 65b. A gate valve 59 is provided so that the substrate board 51 can be placed in or removed from the preparation chamber 57. Five to fifty units of the substrate board 51 shown in FIG. 4C (FIG. 5 shows seven units) are positioned in positive polarity in the reaction chamber 55. A gas introduction system 73 is provided, such that argon gas for a plasma treatment is introduced by means of a line 75, nitrogen or ammonia by means of a line 77, then a silicon chemical compound vapor, for example, disilane ($Si_2H_6$) by means of a line 79 through a flowmeter 81 and a valve 83 for each line into the reaction chamber 55 by means of a gas introduction port 63.

First, a vacuum of $1 \times 10^{-3}$ to $1 \times 10^{-8}$ Torr, and preferably $5 \times 10^{-4}$ Torr to $1 \times 10^{-8}$ Torr, is drawn on the reaction chamber 55 using a turbo-molecular pump and maintained from 5 to 15 minutes. In this way, the undesirable vapors throughout the adhesive are drawn out and quickly exhausted to the outside. Next, a reactive gas (here, a mixture of disilane and nitrogen gas in the ratio of disilane to nitrogen gas=1:5) is introduced through the gas introduction port 63, passes through the supply side hood 65a, and through a nozzle 67a into a space in the reaction chamber 55 enclosed by a frame-structured holder 69, the hood 65a and the hood 65b. Here, electric power of 1 kilowatt and 13.56 MHz was supplied to a pair of electrodes 85a, 85b provided on the inside of the supply side hood 65a and the discharge side hood 65b. A film of a thickness of 300 to 5000 Å is formed at a temperature from room temperature to 300° C., generally a film of a thickness of 1000 Å (1000 Å±200 Å) is formed at an average deposition rate of about 3 Å/sec for about 10 minutes.

The silicon nitride film formed in this manner in an example had a dielectric strength of $8 \times 10^6$ V/cm or greater and the specific resistance was $2 \times 10^{15} \Omega cm$. The infrared absorption spectrum in the example showed a Si—N bond absorption spectrum of 864 cm$^{-1}$, and the refractive index was 2.0.

Reliability tests were then performed on three hundred of the electronic devices using the lead frame of the present invention as shown in FIG. 2, where the electronic devices were stored under 85° C./85% RH continuous for moisture absorption by the plastic molding, then heated at 260° C. for 3 sec. The results are shown in the following table.

| No. | Film Thickness Å | Absorption Ratio (Wt %) | Cracks |
| --- | --- | --- | --- |
| 1 | 200 | 0.248 | 0/20 |
| 2 | 500 | 0.251 | 0/20 |
| 3 | 1000 | 0.238 | 0/20 |
| 4 | 500 | 0.241 | 0/20 |
| 5 | 2000 | 0.250 | 0/20 |
| 6 | No Film | 0.259 | 20/20 |

As indicated in the results No. 1 to No. 5, there were no defective samples, specifically none of twenty samples were defective, where the protective film was formed. In the case of No. 6, where no protective film was formed, out of twenty samples all were defective.

In this embodiment, the cover film which covers the conductive section may be made of an inorganic material, and the forming method used may be the sputtering method, ion plating method, or other physical film forming methods. The die of the lead frame of this embodiment is positioned lower than the lead, so that the surface of the electronic part and the surface of the lead were made almost the same height, but it is acceptable to coat the lead frame having a previously provided flat surface with an inorganic material and then indenting the die section downward. In addition, it is acceptable to form an opening 32 as shown in FIG. 2 to compensate for the heat distortion.

Figure 8A:
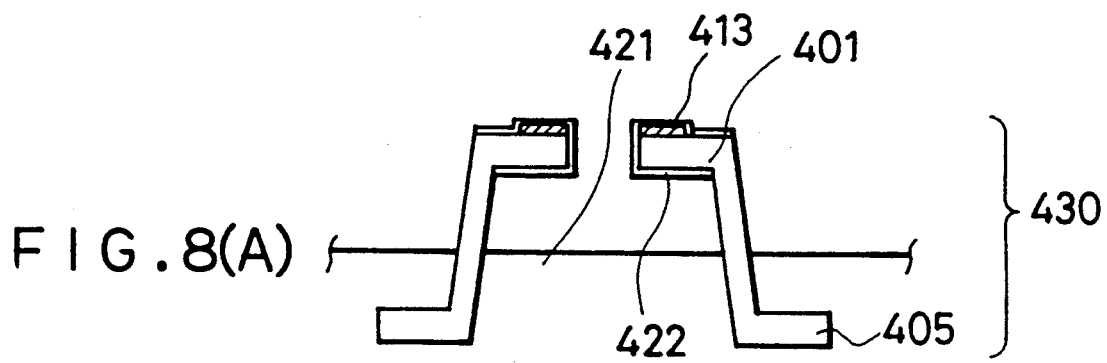
FIGS. 8(A) to 8(G) are cross sectional views showing a method for forming an IC package according to another embodiment of the present invention.
Figure 8B:
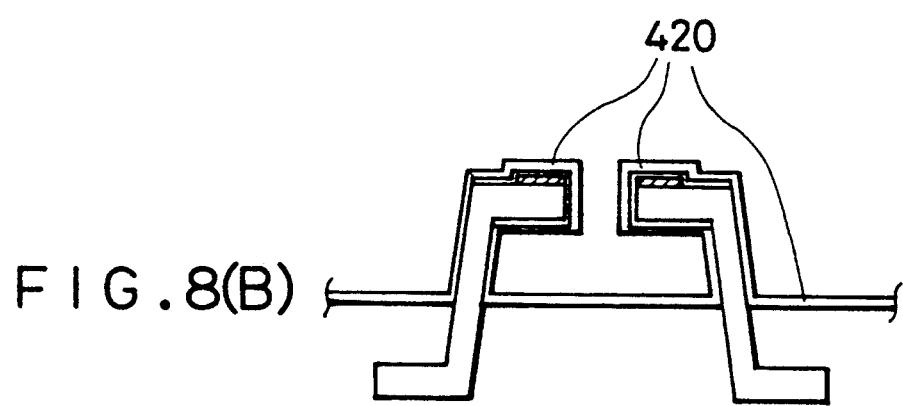
Figure 8C:
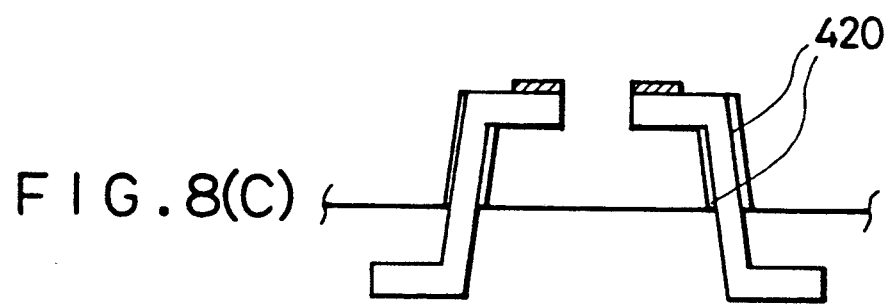
Figure 8D:
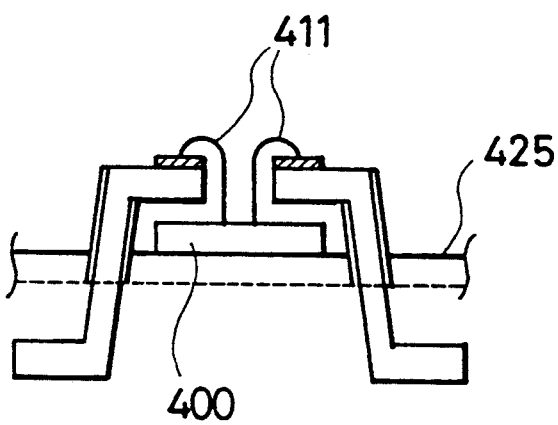
Figure 8E:
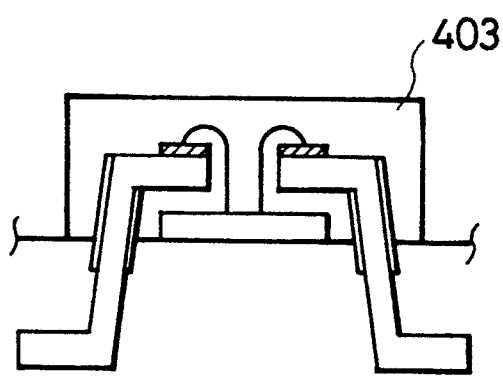
Figure 8F:
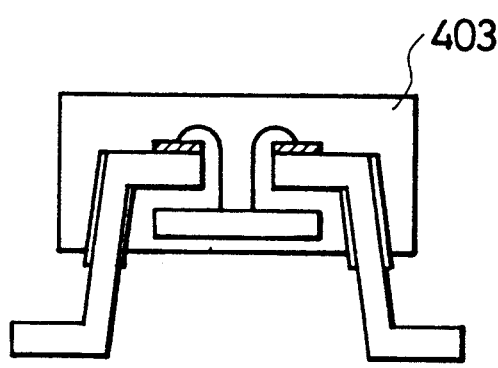
Figure 8G:
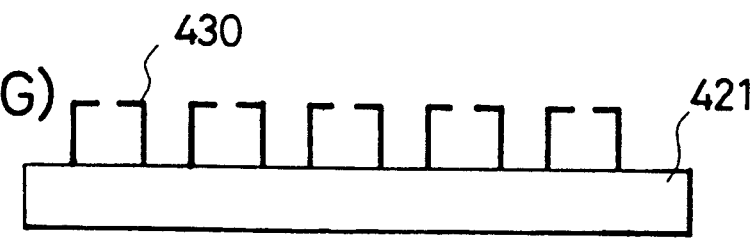
Figure 9:
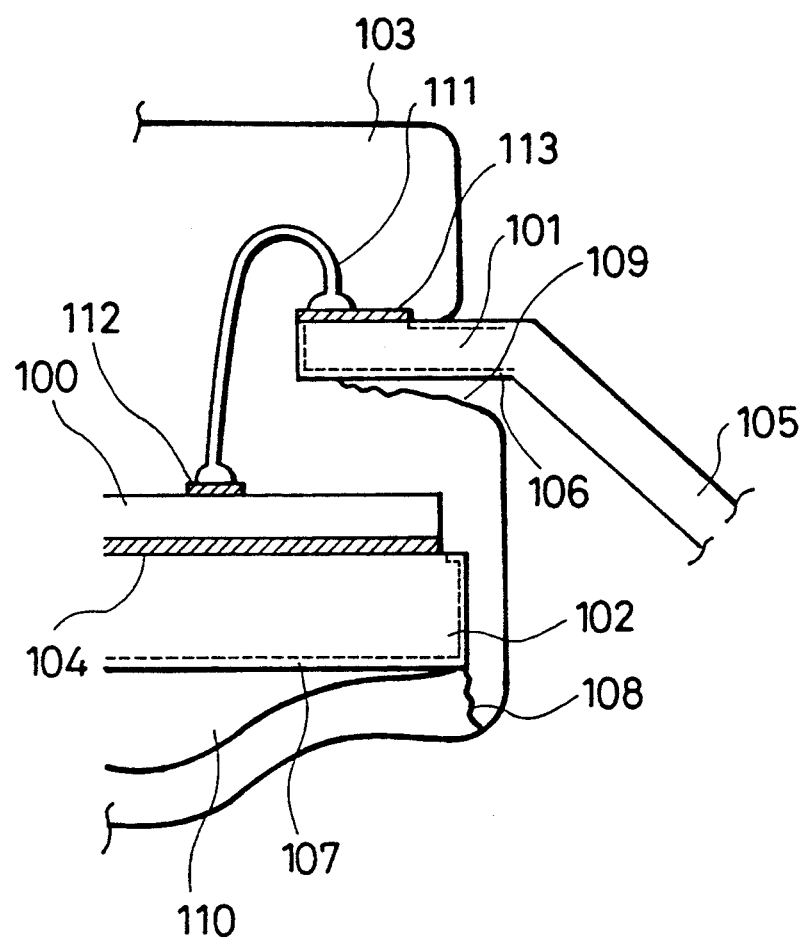
FIG. 9 is a partial cross sectional view showing a conventional IC package.

Referring to FIGS. 8(A) to 8(G), another embodiment according to the present invention will be described below. A liquid polyethylene is prepared by heating and legs 405 of a lead frame 430 are immersed in the liquid polyethylene. Then, the liquid polyethylene is solidified by cooling it to make a stand 421. At this time, a plurality of lead frames may be provided on a stand as shown in FIG. 8(G) to perform a mass production. Then, gold films 413 and organic resin films 422 are formed on conductive portions of the lead frame as shown in FIG. 8(A).

Then, a silicon nitride film is formed on the surface of the lead frame by plasma CVD in a typical parallel plate type RF plasma CVD apparatus at room temperature.

The substrate 421 in the form of a disc as shown in FIG. 8(G) is disposed on one of electrodes in the CVD apparatus and a reaction chamber of the CVD apparatus is evacuated to a pressure of $10^{-4}$ to $10^{-10}$ torr by a turbo molecular pump. This pressure is maintained for 5 to 30 minutes to exhaust gases which are unnecessary or harmful to the film formation since such gases have been produced by vaporization of an organic resin or the like. Then, only argon gas having a purity of 99.9% or more is introduced into the reaction chamber to produce plasma by applying a high frequency electric power to the electrodes at a frequency of 13.56 MHz and an output of 0.1 to 1 KW. After the plasma becomes stable, disilane ($Si_2H_6$) and ammonia ($NH_3$) having purities of 99.99% or more are introduced into the reaction chamber little by little to deposit a film on the surface of the lead frame. The introduction of disilane and ammonia is carried out at a ratio of disilane:ammonia=1:5, for example. In this way, the lead frame is coated with a silicon nitride film 420 having a thickness of 100 to 300 nm as shown in FIG. 8(B). In order to estimate the properties of the silicon nitride film, another silicon nitride film was formed on another substrate in the same way as described above. A dielectric strength thereof was 8 MV/cm or more, an infrared absorption spectrum thereof showed a Is—N bond absorption peak of 864 cm$^{-1}$, a refractive index thereof was 2.0, and the film had a high resistance.

Then, the lead frame is immersed in an organic solvent consisting mainly of toluene while an ultrasonic wave is applied thereto. In this way, the organic resin film 42 and the silicon nitride film 420 formed thereon are removed by lift-off method to expose a conductive portion 413 of the lead frame as shown in FIG. 8(C).

Further, a liquid polyethylene is applied to the stand 421 to a level 425 and solidified to enlarge the stand. Then, a device part 400, e.g., an IC chip, is placed on the stand. The lead frame and the IC chip are wire-bonded to each other by gold wires 411.

Further, the IC chip and the lead frame are enclosed and fixed by an epoxy synthetic resin 403 as shown in FIG. 8(E).

The polyethylene is removed by melting it by heat. Finally, the underside of the IC chip is provided and fixed with an epoxy resin. In this way, an IC device completely enclosed by a molding material is obtained.

Adhesion between metallic material of the lead frame or the like and the molding material is improved by the present invention and therefore the electronic device according to the present invention can be subjected to a high temperature and a high humidity for a long time and to a high temperature process such as soldering with less imperfection produced therein. Further, short circuits are prevented from being produced between the lead frame and the chip. Thus reliability is increased.

The lead frame is coated with the inorganic protective film at a relatively early step in the manufacturing process. Therefore, the subsequent steps do not need to be delicately performed. Thus, a high yield is realized.

The present invention is not limited to the preferred embodiment. For example, the present invention can be applied to a hybrid IC provided with a metal and a condenser are attached. Also, not only wire-bonding, but flip chip bonding or solder bump bonding can be used. In addition, the present invention can be applied to chip on lead (COL) structure.

What is claimed is:

1. An electronic device comprising:
    a package;
    a lead frame partially enclosed in said package;
    a device part enclosed in said package; and
    means for electrically connecting said device part and said lead frame,
    wherein said lead frame is coated with a protective film except for a portion of electric contacts of said lead frame.

2. The device of claim 1 wherein said connecting means comprises a wire connected with said lead frame at one end of said wire and with said device part at the other end of said wire.

3. The device of claim 2 wherein said wire comprises gold.

4. The device of claim 2 wherein said lead frame extends above said device part.

5. The device of claim 4 wherein said wire is connected with said lead frame at said one end above said device part.

6. The device of claim 1 wherein said device part is an integrated circuit chip.

7. The device of claim 1 wherein said package comprises an organic resin.

8. The device of claim 1 wherein said lead frame comprises a material selected from the group consisting of copper and 42 ALLOY.

9. The device of claim 1 wherein said protective film comprises a material selected from the group consisting of silicon oxide, silicon nitride, silicon carbide and carbon.

10. The device of claim 1 wherein said protective film is provided in said package.

* * * * *